(12) United States Patent
Höhler et al.

(10) Patent No.: US 6,779,124 B2
(45) Date of Patent: Aug. 17, 2004

(54) SELECTIVELY DEACTIVATING A FIRST CONTROL LOOP IN A DUAL CONTROL LOOP CIRCUIT DURING DATA TRANSMISSION

(75) Inventors: Rainer Höhler, München (DE); Gunnar Krause, München (DE)

(73) Assignee: Siemens Aktiengesellschaft, Munich (DE)

( * ) Notice: Subject to any disclaimer, the term of this patent is extended or adjusted under 35 U.S.C. 154(b) by 675 days.

(21) Appl. No.: 09/811,881

(22) Filed: Mar. 19, 2001

(65) Prior Publication Data

US 2001/0025350 A1 Sep. 27, 2001

Related U.S. Application Data

(63) Continuation of application No. PCT/DE99/02845, filed on Sep. 8, 1999.

(30) Foreign Application Priority Data

Sep. 18, 1998 (DE) .......................................... 198 42 818

(51) Int. Cl.[7] .............................................. G06F 1/04
(52) U.S. Cl. ........................ 713/400; 713/503; 375/376; 331/25
(58) Field of Search ................................ 713/400, 401, 713/503; 375/376; 331/25, 34

(56) References Cited

U.S. PATENT DOCUMENTS

| 5,485,490 | A | | 1/1996 | Leung et al. |
| 5,734,301 | A | * | 3/1998 | Lee et al. ....................... 331/2 |
| 5,740,123 | A | | 4/1998 | Uchida |
| 5,805,872 | A | | 9/1998 | Bannon |
| 6,487,648 | B1 | * | 11/2002 | Hassoun ..................... 711/167 |

FOREIGN PATENT DOCUMENTS

| GB | 2 320 779 A | 7/1998 |
| WO | WO 95/22200 | 8/1995 |

OTHER PUBLICATIONS

Minoru Kamata et al.; "Third–Order Phase–Locked Loops using Dual Loops with Improved Stability",□□Comm., Comp. and Sig. Proc., 1997. '10 Years PACRIM 1987–1997—Networking the Pacific Rim'. 1997 IEEE Pacific Rim Conf. on , vol.: 1 , Aug. 20–22, 1997 Pg 3.*

Thomas H. Lee et al.; "A 2.5 V CMOS Delay—Locked Loop for an 18 Mbit, 500 Megabyte/s DRAM", IEEE Journal of Solid–State Circuits , vol. 29, No. 12, Dec. 1994.

Stefanos Sidiropoulos et al.: "A Semidigital Dual Delay–Locked Loop", IEEE Journal of Solid–State Circuits, vol. 32, No. 11, Nov. 1997.

* cited by examiner

Primary Examiner—Thomas Lee
Assistant Examiner—Mark A Connolly
(74) Attorney, Agent, or Firm—Laurence A. Greenberg; Werner H. Stemer; Ralph E. Locher

(57) ABSTRACT

The circuit has a clock input for supplying a first clock signal and a clock generator for generating a second clock signal, said clock generator being phase-locked with respect to the first clock signal. The clock output of the clock generator is connected to a control input of a data transmission unit used for outputting data from the circuit and/or for reading into the circuit essentially in synchronism with the first clock signal. The clock generator has at least two control loops connected in succession which are used for controlling the phase angle of the second clock signal, the first control loop being used to generate from the first clock signal at least two intermediate clock signals, each of which has a particular phase angle with respect to the first clock signal, and the second control loop being used to generate the second clock signal from the intermediate clock signals. The first control loop is deactivated during the transmission of data by the data transmission unit, so that the control of the phase angle of the intermediate clock signals is interrupted.

5 Claims, 3 Drawing Sheets

SELECTIVELY DEACTIVATING A FIRST CONTROL LOOP IN A DUAL CONTROL LOOP CIRCUIT DURING DATA TRANSMISSION

CROSS-REFERENCE TO RELATED APPLICATION

This application is a continuation of copending International Application No. PCT/DE99/02845, filed Sep. 8, 1999, which designated the United States.

BACKGROUND OF THE INVENTION

Field of the Invention

The invention relates to a synchronous circuit, such as a synchronous integrated memory. Synchronous memories, for example synchronous DRAMs (SDRAMs) or Rambus DRAMs (RDRAMs), have data connections via which data are transmitted in synchronism with a first clock signal transmitted by a control unit, such as a controller. At relatively high frequencies (>200 MHz), it is necessary for the synchronous memory to generate a second clock signal which is synchronous with the first clock signal and is used to control the synchronous data transmission from or to the memory.

Sidiropoulos and Horowitz, in "Semidigital Dual Delay-Locked Loop", IEEE Journal of Solid State Circuits, Vol. 32 No. 11, November 1997, p. 1683 et seq., describe how an output clock signal which is synchronous with an input clock signal is generated using a two-stage DLL (delay locked loop) circuit. A first phase locked loop (core DLL) generates from the input clock signal six intermediate clock signals each phase-shifted by 30° with respect to one another. A second phase locked loop (peripheral DLL) connected downstream of the first control loop generates the output clock signal by interpolating two respective adjacent intermediate clock signals.

The DLL circuit proposed by Sidiropoulos and Horowitz is thus controlled in two stages:

In the first control loop, the phase angle of the intermediate clock signals is controlled to exactly 30° in each case, and in the second control loop, the phase angle of the output clock signal is controlled, so that it is subsequently in phase with the input clock signal. For performing the interpolation, to generate the output clock signal on the basis of the phase error established with respect to the input clock signal, the second control loop then always selects those of the intermediate clock signals adjacent in terms of phase which are best suited to this purpose. If, by way of example, relatively large changes in temperature cause phase errors in the intermediate clock signals with respect to their nominal values, the first control loop effects a readjustment. This readjustment can sometimes result in an abrupt change in the phase angle of the intermediate clock signals. Since the second control loop always uses two of these intermediate clock signals for its interpolation, these abrupt changes result in likewise abrupt changes in the output clock signal generated by the second control loop.

SUMMARY OF THE INVENTION

It is accordingly an object of the invention to provide a synchronous circuit, which overcomes the above-mentioned disadvantages of the heretofore-known devices and methods of this general type, in which a clock generator is used to generate from a first clock signal a second clock signal which is synchronous with the latter and is used to control the data transmission by means of an output driver and/or an input driver. In this context, the second clock signal is intended to be as phase-locked as possible with respect to the first clock signal, but the data transmission by means of the driver is intended not to be subject to any abrupt changes in the second clock signal.

With the foregoing and other objects in view there is provided, in accordance with the invention, a synchronous circuit, comprising:

a clock input for receiving a first clock signal;

a clock signal generator for generating a second clock signal, the clock signal generator being phase-locked with respect to the first clock signal, having an input connected to the clock input, and having a clock output for outputting the second clock signal;

a data transmission unit for one of outputting data from an integrated circuit and reading data into the integrated circuit substantially in synchronism with the first clock signal;

the data transmission unit having a control input connected to the clock output of the clock signal generator;

the clock signal generator having at least two control loops connected in series for controlling a phase angle of the second clock signal, the at least two control loops including a first control loop for generating from the first clock signal at least two intermediate clock signals each having a particular phase angle with respect to the first clock signal, and a second control loop for generating the second clock signal from the intermediate clock signals; and a deactivation unit connected to the first control loop for deactivating a control of the first control loop during a transmission of data by the data transmission unit, such that a control of the phase angles of the intermediate clock signals is interrupted and corresponding control signals for setting the phase angles are kept constant.

The synchronous circuit may, by way of example, be a synchronous memory or a processor. The fundamental aspect is merely that the circuit is used for data transmission in synchronism with a first clock signal.

The synchronous integrated circuit has a clock input for supplying a first clock signal and a clock generator for generating a second clock signal, which is phase-locked with respect to the first clock signal. This means that the two clock signals have a fixed phase relationship with respect to one another. The clock generator has an input which is connected to the clock input, and a clock output for outputting the second clock signal, said output being connected to a control input of a data transmission unit used for outputting data from the circuit and/or for reading data into the circuit essentially in synchronism with the first clock signal. The clock generator has at least two control loops connected in succession which are used for controlling the phase angle of the second clock signal, the first control loop being used to generate from the first clock signal at least two intermediate clock signals, each of which has a particular phase angle with respect to the first clock signal, and the second control loop being used to generate the second clock signal from the intermediate clock signals. In addition, the circuit has a deactivation unit for deactivating the control of the first control loop during the transmission of data by the data transmission unit, so that the control of the phase angle of the intermediate clock signals is interrupted and corresponding control signals for setting these phase angles are kept constant.

The fact that the control of the first control loop is deactivated during the transmission of data means that no abrupt changes in the phase angles of the intermediate clock signals arise during the data transmission. There are therefore also no otherwise arising abrupt changes in the phase angle of the second clock signal which the second control loop would again first need to correct. If, on the other hand, no data are being transmitted by the data transmission unit, abrupt changes in the phase angle of the intermediate clock signals and of the second clock signal are not critical, since the second clock signal is not required for controlling the data transmission unit in these periods of time. The control of the first control loop can therefore always be activated if no data are to be transmitted by the data transmission unit. Since, in normal operation, there is always alternation between periods of time in which data are transmitted and periods of time in which no data are to be transmitted, the phase angles of the intermediate clock signals are accurately readjusted whenever the first control loop is newly activated.

The data transmission unit may be an input and/or output circuit of the synchronous circuit.

Phase drift in the intermediate clock signals is primarily initiated by fluctuations in temperature during operation of the circuit. Relatively large fluctuations in temperature take place only within relatively long periods of time, however. It is therefore not critical for the first control loop to be deactivated during the periods of time over which the data transmission takes place, which are generally relatively short in this context. Since the second control loop remains activated during the data transmission, provision is also made for adequate correction of lesser interference during the data transmission.

The clock generator can, by way of example, be in the same form as the two-stage DLL circuit described in the above-mentioned article by Sidiropoulos and Horowitz. Its first control loop then generates from the first clock signal a plurality of intermediate clock signals phase-shifted with respect to one another by the same phase angle in each case, and its second control loop generates the second clock signal by means of interpolation between two respective intermediate clock signals which are adjacent in terms of phase.

In accordance with an added feature of the invention:

the first control loop generates from the first clock signal a plurality of intermediate clock signals phase-shifted with respect to one another by the same angle in each case; and the second control loop produces the second clock signal by interpolation between two respective intermediate clock signals positioned adjacent in terms of phase.

In accordance with an additional feature of the invention:

the first control loop has a phase detector for ascertaining the phase difference between at least one of the intermediate clock signals and the first clock signal;

the first control loop is configured to set the control signals in dependence on an output signal from the phase detector; and the first control loop includes a memory unit for storing the control signals, and wherein a memory content of the memory unit is continually changed when the control of the first control loop has been activated and the memory content remains constant when the control of the first control loop has been deactivated.

The first control loop, in this development, has a phase detector for ascertaining the phase difference between at least one of the intermediate clock signals and the first clock signal. The first control loop sets its control signals, which are used for setting the phase angles of the intermediate clock signals, on the basis of an output signal from the phase detector. In addition, the first control loop has a memory unit for storing the control signals, whose memory content is continually changed when the control of the first control loop has been activated and whose memory content remains constant when the control of the first control loop has been deactivated.

The memory unit advantageously ensures that the control signals are kept constant during the deactivation of the first control loop, that is to say during the data transmission by the data transmission unit.

In accordance with another feature of the invention, an external control unit is connected to the deactivation unit via an input. The external control unit controls the data transmission by the data transmission unit and outputs a control signal to the deactivation unit for deactivating the control of the first control loop in dependence on the control signal.

In accordance with a concomitant feature of the invention, an external control unit is connected to an output and receives therefrom a control signal controlling the data transmission by the data transmission unit. The control signal indicates whether or not the first control loop has been deactivated by the deactivation unit.

In the embodiment of the synchronous circuit that has an input for receiving a control signal from an external control unit used for controlling the data transmission by the data transmission unit, the deactivation unit of the memory deactivates the control of the first control loop on the basis of the control signal. If the synchronous circuit is a synchronous memory, the control unit may be a controller or microprocessor, for example, which controls the transmission of data by means of the data transmission unit by addressing the memory. Since, in this case, the external control unit stipulates when data transmission is to take place, it can easily also be used to transmit the appropriate control signal to the deactivation unit, so that the first control loop is deactivated at the same time as the data transmission which is to take place.

In the alternative embodiment in which the circuit has an output for transmitting a control signal to an external control unit used for controlling the data transmission by the data transmission unit, the control signal indicates whether the first control loop has been deactivated by the deactivation unit. This embodiment is advantageous if the circuit deactivates its first control loop independently of the external control unit by activating and deactivating the first control loop at stipulated time intervals, for example. These time intervals can be proportioned such that the intermediate clock signals are controlled with sufficient accuracy by the first control loop, and relatively large phase errors are prevented. The control signal transmitted to the external control unit indicates to the latter when the data transmission by means of the data transmission unit can be started, because the first control loop has then been deactivated, and when no data can be transmitted, because the first control loop is currently active.

Other features which are considered as characteristic for the invention are set forth in the appended claims.

Although the invention is illustrated and described herein as embodied in a synchronous circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
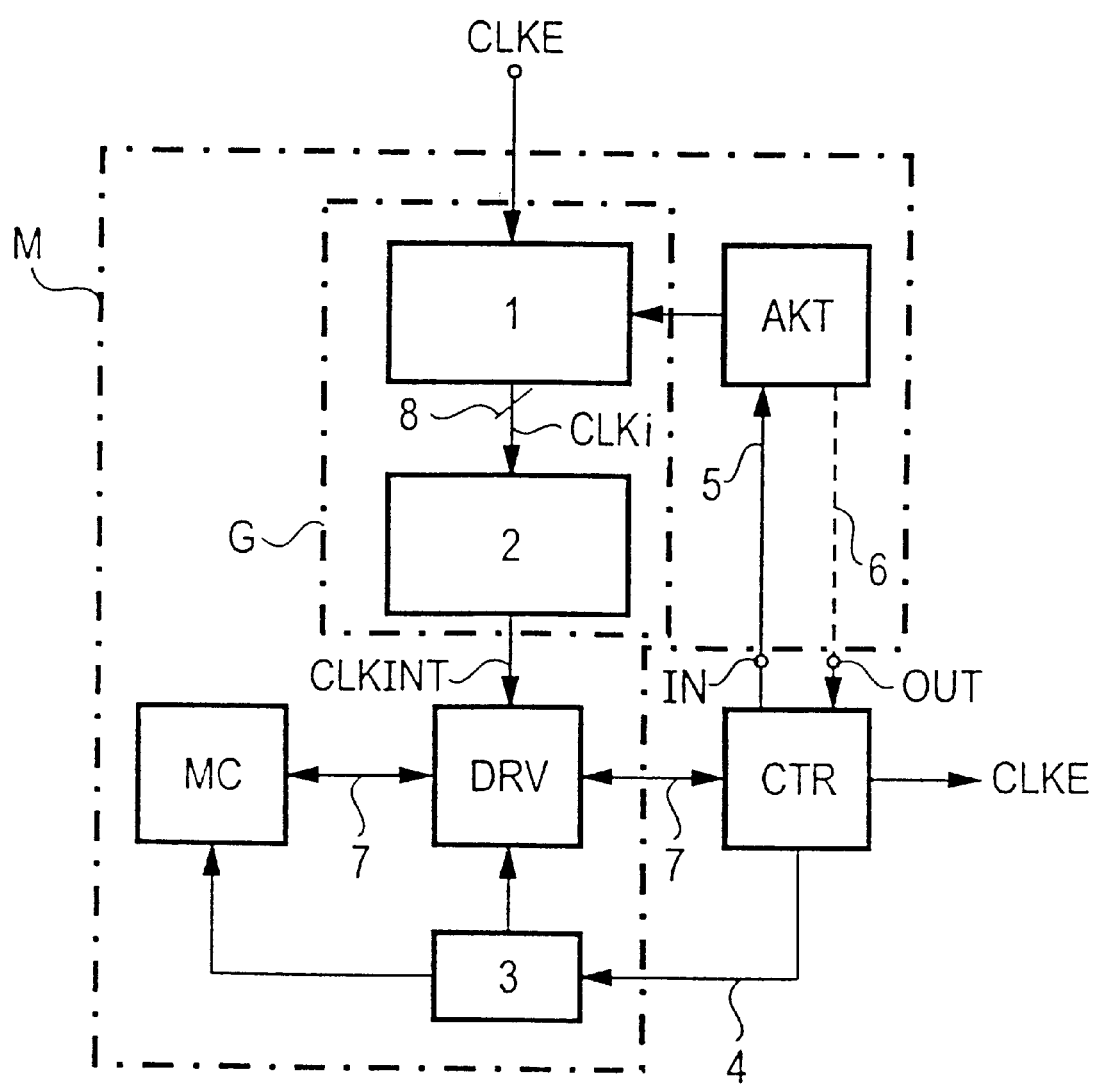
FIG. 1 is a block diagram of an exemplary embodiment of the synchronous circuit in the form of an integrated memory.

Referring now to the figures of the drawing in detail and first, particularly, to FIG. 1 thereof, there is seen a synchronous integrated memory M, of which only the components fundamental to the invention are shown. The memory M has a memory area MC containing memory cells which store data. It also has a data transmission unit or interface DRV which transmits data 7 which are to be stored to the memory area MC and transmits data 7 which are to be read from the memory area MC to outside the memory M. Arranged outside the memory is an external control unit CTR, for example a microprocessor. The control unit CTR transmits data which are to be written into the memory M to the data transmission unit DRV. In addition, data which are being read are transmitted from the data transmission unit DRV to the external control unit CTR.

The memory M also has an internal control unit 3 to which the external control unit CTR supplies control signals 4, on the basis of which it addresses the memory cells within the memory area MC and activates or deactivates the data transmission unit DRV. The internal control unit 3 contains, among other things, an address decoding unit to which the external control unit CTR supplies transmitted addresses. The external control unit CTR also generates a first clock signal CLKE, which is supplied to a clock input of the memory M and with which data 7 will be transmitted synchronously by means of the data transmission unit DRV.

For the data transmission unit DRV to output the data 7 in synchronism with the first clock signal CLKE, the memory M has a clock signal generator G which generates from the first clock signal CLKE a second clock signal CLKINT, which is phase-locked with respect to the first clock signal. The second clock signal CLKINT is supplied to a control input of the data transmission unit DRV. The transmission of the data 7 is thus clocked by the second clock signal CLKINT.

The clock generator G in FIG. 1 has two control loops 1, 2 connected in series. The input of the first control loop 1 has the first clock signal CLKE supplied to it. The first control loop 1 has eight outputs, at which it generates eight intermediate clock signals CLKi which are each phase-shifted by 45° with respect to one another. Inputs of the second control loop 2 have the eight intermediate clock signals CLKi supplied to them. The second control loop generates the second clock signal CLKINT, which is synchronous with the first clock signal CLKE, at its output, which is connected to the control input of the data transmission unit DRV.

Figure 2:
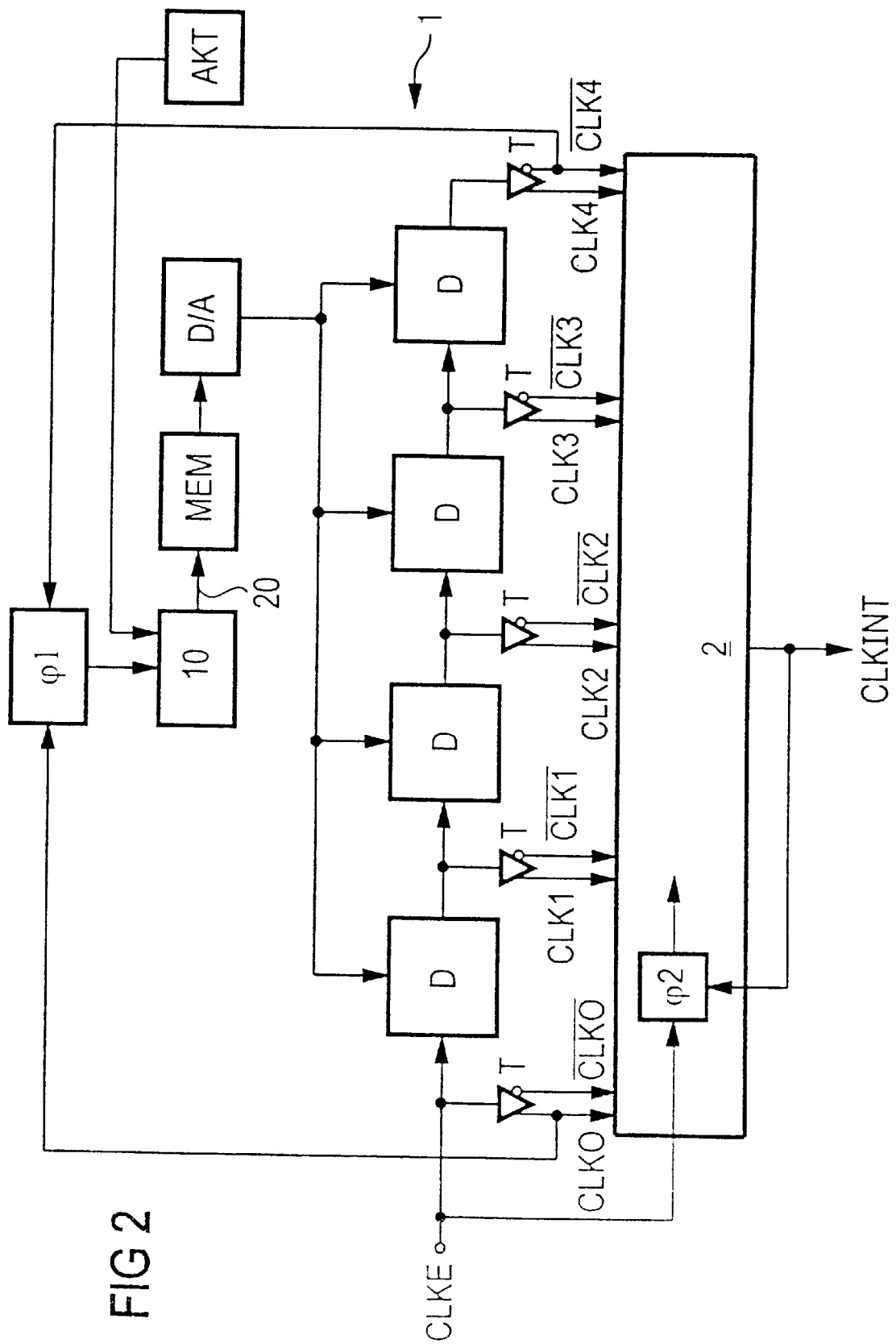
FIG. 2 is a block diagram of an exemplary embodiment of a first control loop of FIG. 1.

Referring now to FIG. 2, there is shown an illustrative embodiment of the first control loop 1. The first control loop 1 and the second control loop 2 form a DLL circuit. The second control loop 2, in particular, but also a few components of the first control loop 1, may be in the same form as the control loops in the article by Sidiropoulos and Horowitz which was mentioned in the introductory text. As shown in FIG. 2, the first control loop 1 has four analog delay elements D which are arranged in succession in a series circuit and whose delay times can be set. An input of the series circuit has the first clock signal CLKE supplied to it. Each delay element D causes a 45° phase shift in its input clock signal. Arranged upstream and downstream of each delay element D is a driver circuit T used to amplify the input and output signals of the delay elements D and to output these signals in inverted and uninverted form. As output signals from the first control loop, the driver circuits T each transmit the appropriate clock signal phase-shifted by the associated delay element as intermediate clock signal CLKi and the associated inverted clock signal /CLKi to the second control loop 2.

Figure 3:
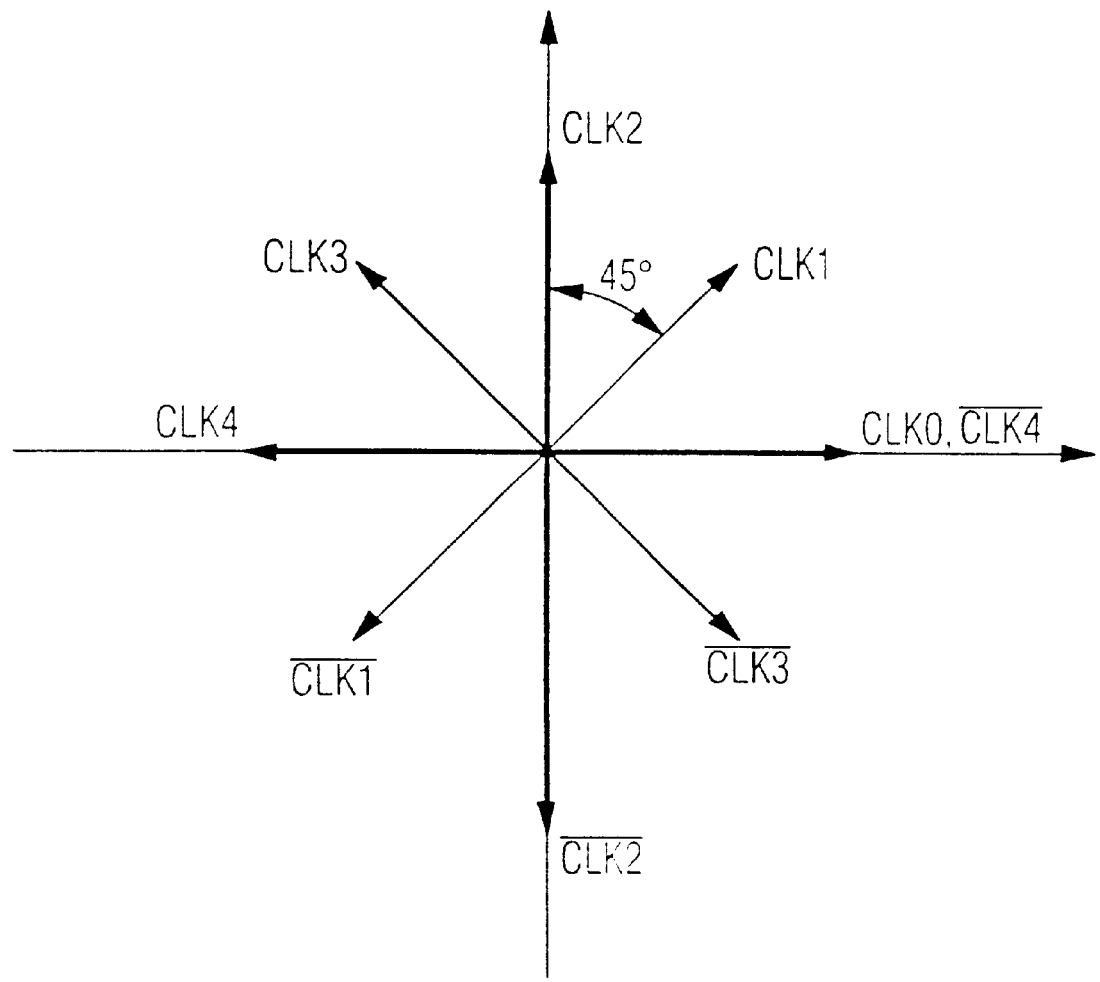
FIG. 3 is a phase diagram illustrating intermediate clock signals from FIG. 2.

Referring now to FIG. 3, there is shown a phase diagram showing the phase angle of the eight intermediate clock signals CLKi in the corrected state.

The inverted output signal /CLK4 from the last delay element D in the series circuit in FIG. 2 is supplied to a first phase detector φ1, which compares its phase angle with the phase angle of the first clock signal CLKE. The result of the comparison is transmitted to a control unit 10 of the first control loop 1, and this control unit generates appropriate digital control signals 20 used to set the delay by the delay element D. The control signals 20 are stored in a memory unit MEM and are constantly updated in the event of phase errors established by the first phase detector φ1. The control signals stored in the memory unit MEM are supplied to a digital/analog converter D/A, which supplies the control signals converted into analog form to control inputs of the delay elements D.

In the exemplary embodiment, the control unit 10 of the first control loop and also its memory unit MEM are digital components. However, these components may also be in analog form in other embodiments of the invention. In addition, it is possible for the delay elements D to be digital components, unlike in this exemplary embodiment. The digital/analog converter D/A shown at the output of the memory unit MEM is then not required. The first phase detector φ1 may also be in either analog or digital form.

The second control loop 2 has the eight intermediate clock signals CLKi generated by the first control loop 1 supplied to it. On the basis of a result signal from a second phase detector φ2, which establishes the phase difference between the second clock signal CLKINT, generated by the second control loop 2, and the first clock signal CLKE, the second control loop 2 selects from the intermediate clock signals CLKINT each having a phase difference of 45° those which are adjacent in terms of phase. In addition, the second control loop 2 performs interpolation between these two selected intermediate clock signals CLKi on the basis of the phase difference established by the second phase detector φ2.

As shown in the two figures, the memory M has a deactivation unit AKT, whose output is connected to the control unit 10 of the first control loop 1, as shown in FIG. 2. The deactivation unit AKT always activates the first control loop 1 when no data are to be transmitted by the data transmission unit DRV. It deactivates the first control loop 1 when data 7 are being transmitted by the data transmission unit DRV. In the activated state, the first control loop 1 controls the phase angles of its intermediate clock signals CLKi by changing its control signals 20. However, if it is deactivated by the deactivation unit AKT, the control of the first control loop 1 is interrupted, and its control unit 10 no longer matches the control signals stored in the memory unit MEM. When the first control loop 1 has been deactivated, the control signals stored in the memory unit MEM are thus kept constant, even if the first phase detector φ1 establishes a phase error. The effect achieved by the control signals 20 being kept constant is that a change in the phase angle of the intermediate clock signals CLKi is initiated only by fault influences, such as changes in temperature, but not as a result of any control. While the first control loop 1 is sporadically deactivated, the second control loop 2 is constantly activated, so that it also controls the phase angle of the second clock signal CLKINT while data 7 are being transmitted by means of the data transmission unit DRV. Hence, exact phase control of the second clock signal CLKINT is also ensured in the deactivated state of the first control loop 1. Deactivation of the first control loop 1 during the transmission of data 7 by the data transmission unit DRV has the advantage that the control unit 10 of the first control loop 1 does not abruptly change the control signals 20 stored in the memory unit MEM during this period of time. Consequently, no abrupt change in the delay times of the delay elements D is initiated. To correct the fault influences arising during deactivation of the first control loop 1, the second control loop 2 is sufficient. During the transmission of the data by means of the data transmission unit DRV, the synchronism with the external clock signal CLKE is thus ensured without there being any abrupt changes which would be manifested in phase jitter in the internal clock signal CLKINT.

As soon as there are no data to be transmitted by means of the data transmission unit DRV, the first control loop 1 is activated again by the deactivation unit AKT, so that relatively large fault influences can then also be corrected with the cooperation of the first control loop 1. The control influences arising in this context on account of abrupt changes in the control signals 20 within the first control loop 1 are then harmless, since the second clock signal CLKINT is not required for controlling the data transmission unit DRV during these periods of time.

With the first control loop 1 activated, that is to say before the next output of data by the data transmission unit DRV, the internal clock signal CLKINT is thus controlled in optimum fashion. During the periods of time in which data are transmitted, the first control loop 1 is deactivated, and the exact phase angle of the second clock signal CLKINT is ensured solely by the control of the second control loop 2.

FIG. 1 shows that the memory M has an input IN via which a control signal 5 from the external control unit CTR is supplied to the deactivation unit AKT. The external control unit CTR uses this control signal 5 to control the activation state of the first control loop 1. In this illustrative embodiment, the external control unit CTR uses the control signal 5 to ensure that the first control loop 1 is always deactivated by the deactivation unit AKT when the external control unit CTR transmits to the internal control unit 3 of the memory M the instruction for outputting data 7 stored in the memory area MC or for reading in data 7 which are to be stored. This ensures that the control loop 1 is deactivated no later than at the same time as the data transmission unit DRV transmits data 7. In other illustrative embodiments of the invention, this control signal 5 can also be derived within the memory from the control signals 4 of the external control unit CTR which are transmitted to the internal control unit 3 of the memory M, which means that an additional input of the memory is not required.

As an alternative to the exemplary embodiment of the memory which has just been explained, that is to say as an alternative to providing the input IN for transmitting the control signal 5, the memory M may also (as shown in dashes in FIG. 1) have an output OUT for outputting a control signal 6 from the deactivation unit AKT to the external control unit CTR. In this case, the deactivation unit AKT notifies the external control unit CTR of when it activates the first control loop 1 and when it deactivates it. If the control signal 6 indicates that the first control loop 1 is currently activated, the external control unit CTR will not transmit to the internal control unit 3 any instructions for the transmission of data 7. Only when the deactivation unit AKT notifies it of the fact that the first control loop 1 has been deactivated is a command for the transmission of the data 7 transmitted. The last-outlined illustrative embodiment of the memory has the advantage that the activation and deactivation of the first control loop 1 can be automatically controlled by the memory M. By way of example, the deactivation unit AKT may then contain a timer unit and perform the activation and deactivation at regular, not too lengthy time intervals, so that the phase angle of the second clock signal CLKINT can always be controlled in optimum fashion.

Naturally, other embodiments of the memory in which more than two control loops are connected in succession are also possible. The control loops arranged at the input of the clock generator G, such as the first control loop 1 in FIG. 1, are used for coarse control of the phase angle of the second clock signal CLKINT. By contrast, control loops arranged closer to the output of the clock generator G are used for ever finer control of its phase angle. In FIG. 1, the first control loop 1 is thus responsible for coarse control, and the second control loop 2 is responsible for fine control of the phase angle of the second clock signal CLKINT. When there are more than two control loops present within the clock generator G, it is useful always to deactivate those control loops (one or more) which are responsible for coarse control, and to leave the fine control activated.

Although the control loops 1, 2 described here form a DLL circuit, the invention can also be implemented using other control principles, for example using PLL (phase locked loop) circuits. The important aspect is merely that the clock generator G has an at least two-stage control loop, as shown in FIG. 1.

Provision may also be made for the control of the control loop 1 not to be deactivated whenever data are being transmitted by the data transmission unit DRV. By way of example, this may occur only in a normal mode of the memory M, while in a test mode the first control loop 1 remains constantly activated. Provision may also be made for the first control loop 1 not to be activated again each time no data are currently being output, but rather only during particular operating states of the memory M, for example when it is initialized or when output drivers within the data transmission unit DRV are being calibrated. It is also possible for the first control loop to be deactivated only when the data transmission unit DRV is either outputting or reading in data 7.

We claim:

1. A synchronous circuit, comprising:
   a clock input for receiving a first clock signal;
   a clock signal generator for generating a second clock signal, said clock signal generator being phase-locked with respect to the first clock signal, having an input connected to said clock input and having a clock output for outputting the second clock signal;
   a data transmission unit for one of outputting data from an integrated circuit and reading data into the integrated circuit substantially in synchronism with the first clock signal;
   said data transmission unit having a control input connected to said clock output of said clock signal generator;

said clock signal generator having at least two control loops connected in series for controlling a phase angle of the second clock signal, said at least two control loops including a first control loop for generating from the first clock signal at least two intermediate clock signals each having a particular phase angle with respect to the first clock signal, and a second control loop for generating the second clock signal from the intermediate clock signals; and a deactivation unit connected to said first control loop for deactivating a control of said first control loop during a transmission of data by said data transmission unit, such that a control of the phase angles of the intermediate clock signals is interrupted and corresponding control signals for setting the phase angles are kept constant.

2. The synchronous circuit according to claim 1, wherein said first control loop generates from the first clock signal a plurality of intermediate clock signals phase-shifted with respect to one another by the same angle in each case; and said second control loop produces the second clock signal by interpolation between two respective intermediate clock signals positioned adjacent in terms of phase.

3. The synchronous circuit according to claim 1, wherein said first control loop has a phase detector for ascertaining the phase difference between at least one of the intermediate clock signals and the first clock signal;

said first control loop is configured to set the control signals in dependence on an output signal from the phase detector; and said first control loop includes a memory unit for storing the control signals, and wherein a memory content of said memory unit is continually changed when the control of said first control loop has been activated and the memory content remains constant when the control of said first control loop has been deactivated.

4. The synchronous circuit according to claim 1, which further comprises an input and an external control unit connected to said deactivation unit via said input, said external control unit controlling the data transmission by said data transmission unit and outputting a control signal to said deactivation unit for deactivating the control of said first control loop in dependence on the control signal.

5. The synchronous circuit according to claim 1, which further comprises an output and an external control unit connected to said output for receiving therefrom a control signal controlling the data transmission by said data transmission unit, the control signal indicating whether or not said first control loop has been deactivated by said deactivation unit.

* * * * *